(12) United States Patent
Moroi

(10) Patent No.: US 10,047,436 B2
(45) Date of Patent: Aug. 14, 2018

(54) RAW MATERIAL SUPPLY METHOD, RAW MATERIAL SUPPLY APPARATUS, AND STORAGE MEDIUM

(71) Applicant: TOKYO ELECTRON LIMITED, Tokyo (JP)

(72) Inventor: Masayuki Moroi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 129 days.

(21) Appl. No.: 15/077,952

(22) Filed: Mar. 23, 2016

(65) Prior Publication Data

US 2016/0281226 A1    Sep. 29, 2016

(30) Foreign Application Priority Data

Mar. 27, 2015    (JP) .................................. 2015-066899

(51) Int. Cl.
```
C23C 16/52         (2006.01)
C23C 16/455        (2006.01)
C23C 16/08         (2006.01)
```
(52) U.S. Cl.
CPC ............ C23C 16/455 (2013.01); C23C 16/08 (2013.01); C23C 16/45525 (2013.01); C23C 16/45561 (2013.01); C23C 16/52 (2013.01)

(58) Field of Classification Search
CPC . C23C 16/455; C23C 16/08; C23C 16/45525; C23C 16/45561; C23C 16/52
See application file for complete search history.

(56) References Cited

U.S. PATENT DOCUMENTS

2012/0298207 A1* 11/2012 Woelk ................ C23C 16/4481
                                                         137/2
2017/0107118 A1*  4/2017 Nakagawa ........... C01G 55/008

FOREIGN PATENT DOCUMENTS

| JP | 2008-240119 A | 10/2008 |
| KR | 1020120089202 A | 8/2012 |
| KR | 1020140098684 A | 8/2014 |

OTHER PUBLICATIONS

Larrabee et al. An atomic layer deposition reactor with dose quantification for precursor adsorption and reactivity studies, Rev. Sci. Instrum. 84, 014102 (2013) . (Year: 2013).*

* cited by examiner

Primary Examiner — Kelly M Gambetta
(74) Attorney, Agent, or Firm — Nath, Goldberg & Meyer; Jerald L. Meyer

(57) ABSTRACT

A method includes: transmitting a sublimated raw material together with a carrier gas to a raw material trapping part where the raw material is temporarily trapped; calculating a difference between trapped amounts of the raw material trapped in the raw material trapping part during a predetermined period of time as an increase in trapped amount; obtaining at least one of a period of time required to reach the trapped amount to a target value and a trapping rate of the raw material, based on the increase, a period of trapping time, and a trapped amount measured at the time of completing trapping the raw material; refilling the raw material into the raw material trapping part based on the at least one of the period of refilling time and the trapping rate; and sublimating the raw material and supplying the same together with the carrier gas to a consumption area.

5 Claims, 9 Drawing Sheets

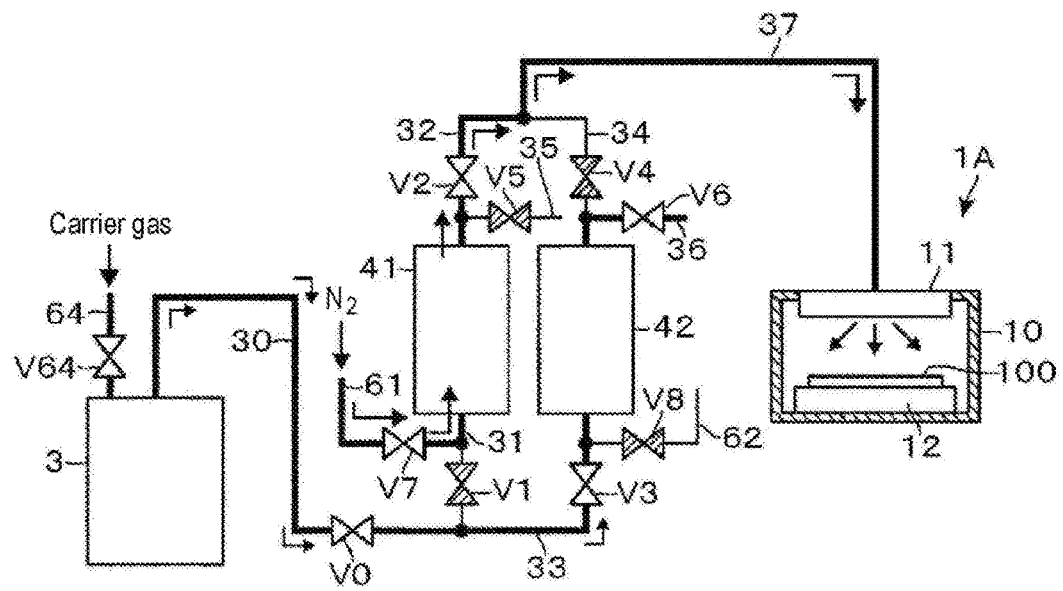
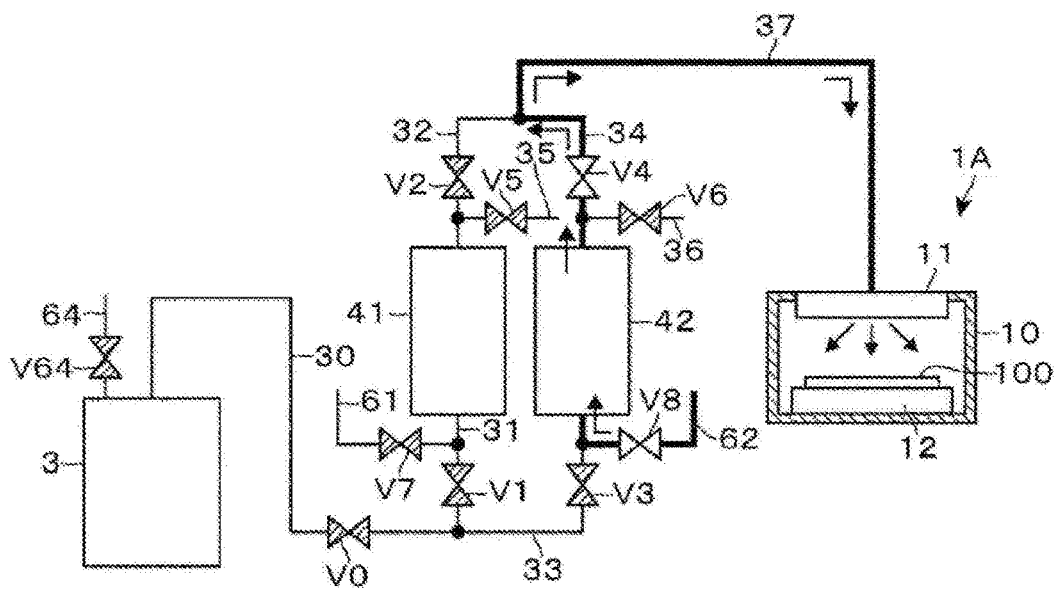

RAW MATERIAL SUPPLY METHOD, RAW MATERIAL SUPPLY APPARATUS, AND STORAGE MEDIUM

CROSS-REFERENCE TO RELATED APPLICATION

This application claims the benefit of Japanese Patent Application No. 2015-066899, filed on Mar. 27, 2015, in the Japan Patent Office, the disclosure of which is incorporated herein in its entirety by reference.

TECHNICAL FIELD

The present disclosure relates to a technique of vaporizing a solid raw material to supply the same to a consumption area of a raw material.

BACKGROUND

As a film forming process, which is a type of semiconductor manufacturing process, there are an Atomic Layer Deposition (ALD) process of alternately supplying a raw material gas and a reaction gas of, for example, oxidizing, nitriding or reducing the raw material gas, a Chemical Vapor Deposition (CVD) process of decomposing a raw material gas in a gas phase or reacting the raw material gas with a reaction gas, and so on. As the raw material gas used in this film forming process, a gas sublimated from the solid raw material may be used to increase a density of a crystal after the film formation and reduce an amount of impurities introduced to a substrate, and is used, for example, in forming a high dielectric film by ALD.

As a raw material supply apparatus using the solid raw material, an apparatus having a configuration in which an inert gas, for example, a carrier gas as a nitrogen gas, is supplied into a raw material vessel surrounded by a heater to supply a sublimated gas together with the carrier gas into a process chamber through a gas supply path, has been known.

However, in sublimating the solid raw material within the raw material vessel and supplying the same, a temperature of a portion sprayed by the carrier gas on a surface of the solid raw material within the raw material vessel, is decreased by heat from evaporation, or an inner wall of the raw material vessel is heated. This causes a temporal change in sublimation efficiency. In particular, when the solid raw material is reduced, the sublimation efficiency of the raw material tends to be lowered. As such, a supply amount of the raw material supplied into a process vessel as a consumption area from the raw material vessel is destabilized. Such a destabilization deteriorates the uniformity of quality or thickness of a thin film between substrates, which results in a reduction in yield. Thus, it is required to establish a technique capable of stably supplying a raw material to a process vessel.

SUMMARY

Some embodiments of the present disclosure provide a technique of stabilizing a flow rate of a raw material supplied to a consumption area in sublimating a solid raw material and supplying the same to the consumption area.

According to one embodiment of the present disclosure, there is provided a raw material supply method for use in a raw material supply apparatus including a raw material vessel configured to store a solid raw material and a raw material trapping part configured to temporarily trap a raw material transmitted from the raw material vessel, the method including: sublimating the solid raw material stored in the raw material vessel and transmitting the sublimated raw material together with a carrier gas to the raw material trapping part such that the sublimated raw material is trapped in the raw material trapping part; measuring a first trapped amount of the raw material trapped in the raw material trapping part and a second trapped amount of the raw material trapped in the raw material trapping part after a predetermined period of time, and calculating a difference between the first trapped amount and the second trapped amount as an increase in trapped amount of the raw material; obtaining at least one of a period of time required to reach the trapped amount of the raw material trapped in the raw material trapping part to a target value and a trapping rate of the raw material, based on the increase, a period of time required to trap the raw material, and a trapped amount of the raw material at the time of completing trapping the raw material; refilling the raw material into the raw material trapping part from the raw material vessel based on the at least one of the period of refilling time and the trapping rate; and subsequently, sublimating the raw material and supplying the sublimated raw material together with the carrier gas to a consumption area from the raw material trapping part.

According to another embodiment of the present disclosure, there is provided a non-transitory computer-readable storage medium storing a computer program for use in a raw material supply apparatus including a raw material vessel configured to store a solid raw material and a raw material trapping part configured to temporarily trap a raw material transmitted from the raw material vessel, wherein the computer program is organized with instructions for executing the aforementioned raw material supply method.

According to yet another embodiment of the present disclosure, there is provided a raw material supply apparatus that heats a solid raw material to sublimate the solid raw material and supplies the sublimated raw material together with a carrier gas to a consumption area, including: a raw material vessel configured to store the solid raw material; a raw material trapping part installed in a downstream side of the raw material vessel and configured to temporarily trap a raw material transmitted from the raw material vessel and subsequently sublimate the trapped raw material and supply the sublimated raw material to the consumption area; an upstream valve and a downstream valve respectively installed at an upstream side and a downstream side of the raw material trapping part; an exhaust part installed in an upstream side of the downstream valve such that, when the raw material transmitted from the raw material vessel is trapped in the raw material trapping part, a gas from the raw material trapping part is exhausted; a measurement part configured to measure a trapped amount of the raw material trapped in the raw material trapping part; and a control part configured to output a control signal to execute a series of acts of: supplying the raw material from the raw material vessel to the raw material trapping part such that the raw material is trapped in the raw material trapping part; measuring a first trapped amount of the raw material trapped in the raw material trapping part and a second trapped amount of the raw material trapped in the raw material trapping part after a predetermined period of time, and calculating a difference between the first trapped amount and the second trapped amount as an increase in trapped amount of the raw material; obtaining at least one of a period of time required to reach the trapped amount of the raw material trapped in the raw material trapping part to a target value and a trapping rate of the raw material, based on the increase, a period of time required to trap the raw material, and a trapped amount of the raw material at the time of completing trapping the raw material; refilling the raw material into the raw material trapping part from the raw material vessel based on the at least one of the period of time and the trapping rate; and subsequently, sublimating the raw material and supplying the sublimated raw material together with the carrier gas to the consumption area from the raw material trapping part.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is an explanatory view illustrating an operation of the raw material supply apparatus according to an embodiment of the present disclosure.

FIG. 7 is an explanatory view illustrating an operation of the raw material supply apparatus according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
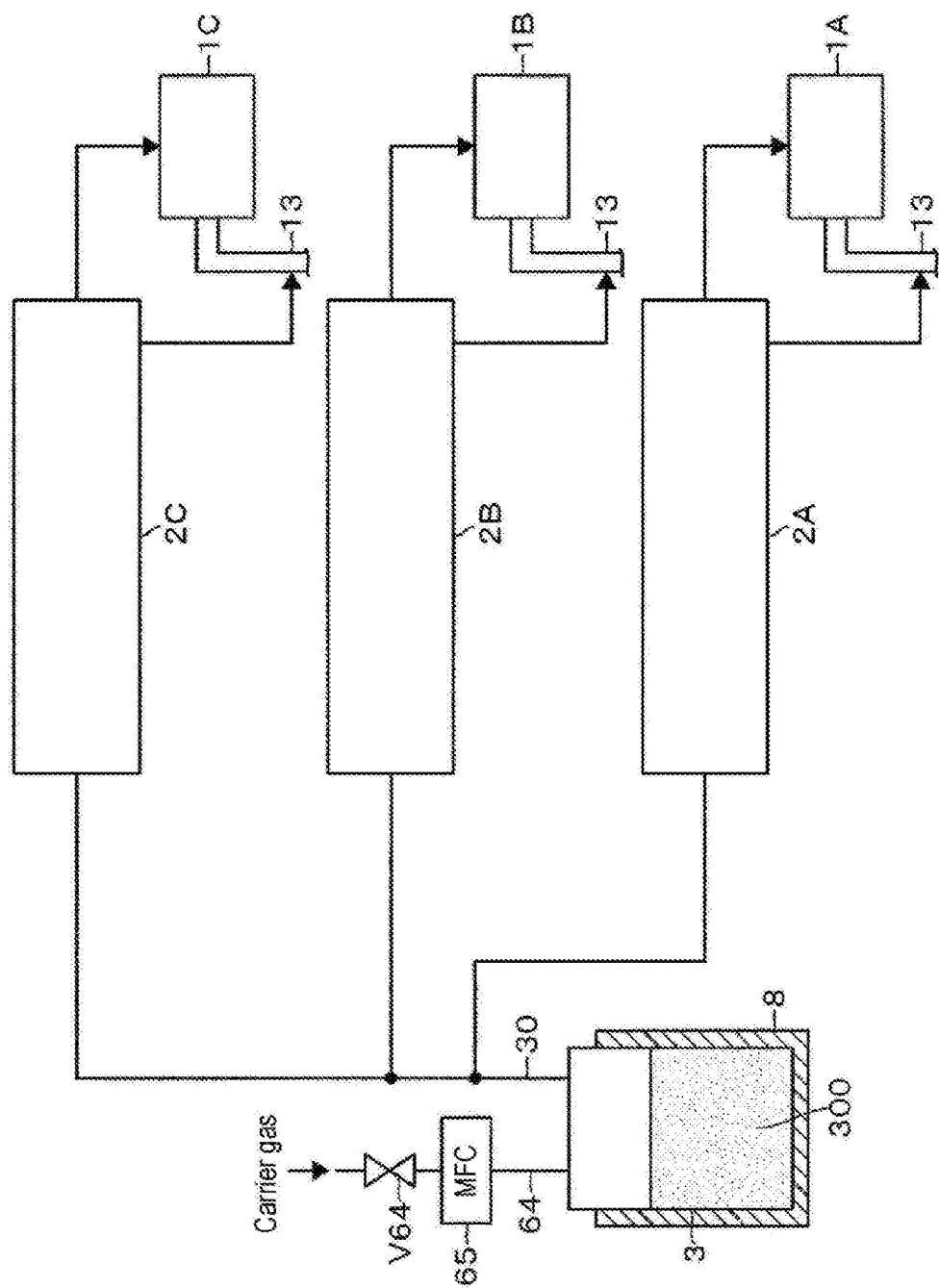
FIG. 1 is a view illustrating an overall configuration of a film forming apparatus employing a raw material supply apparatus according to an embodiment of the present disclosure.

An embodiment in which a raw material supply apparatus according to the present disclosure is applied to a film forming apparatus will be described with reference to FIGS. 1 to 4. As illustrated in FIG. 1, the film forming apparatus includes: a plurality of (e.g., three) film forming process parts 1A to 1C as consumption areas of a raw material gas, each of which performs a film forming process on a semiconductor wafer (hereinafter, referred to as a "wafer") as a substrate using, for example, a so-called ALD method; raw material supply systems 2A to 2C each of which supplies a raw material gas to the respective film forming process parts 1A to 1C; and a common raw material vessel 3 which refills a raw material into each of the raw material supply systems 2A to 2C as described later. The film forming process parts 1A to 1C correspond to the consumption areas in which the raw material gas is consumed. In this embodiment, as the ALD method, an example in which a tungsten (W) film is formed using a combination of a tungsten hexachloride ($WCl_6$) as the raw material gas and a hydrogen ($H_2$) gas as a reaction gas (reduction gas), as a processing gas, is described.

The raw material vessel 3 is made of, for example, stainless steel, and stores $WCl_6$ (raw material) which is in a solid (powder) state at room temperature as a solid raw material 300. A ceiling portion of the raw material vessel 3 is connected to a downstream end of a carrier gas supply path 64 through which an inert gas (e.g., an $N_2$ (nitrogen) gas) as a carrier gas is introduced to the raw material vessel 3, and an upstream end of a raw material refilling pipe 30 through which the raw material gas is supplied from the raw material vessel 3 to each of the raw material supply systems 2A to 2C for refill of the raw material. A mass flow controller 65 and a valve V64 which adjust a flow rate of the carrier gas are installed in the carrier gas supply path 64.

The raw material vessel 3 is surrounded by a heater 8, for example, a jacket-shaped mantle heater having a resistance heating element. The heater 8 of the raw material vessel 3 is configured to adjust a temperature of the raw material vessel 3 with an adjustment of power applied from a power source (not shown). A temperature of the heater 8 of the raw material vessel 3 is set to fall within a range in which the solid raw material 300 is sublimated and $WCl_6$ is not decomposed, e.g., to 150 degrees C.

Figure 2:
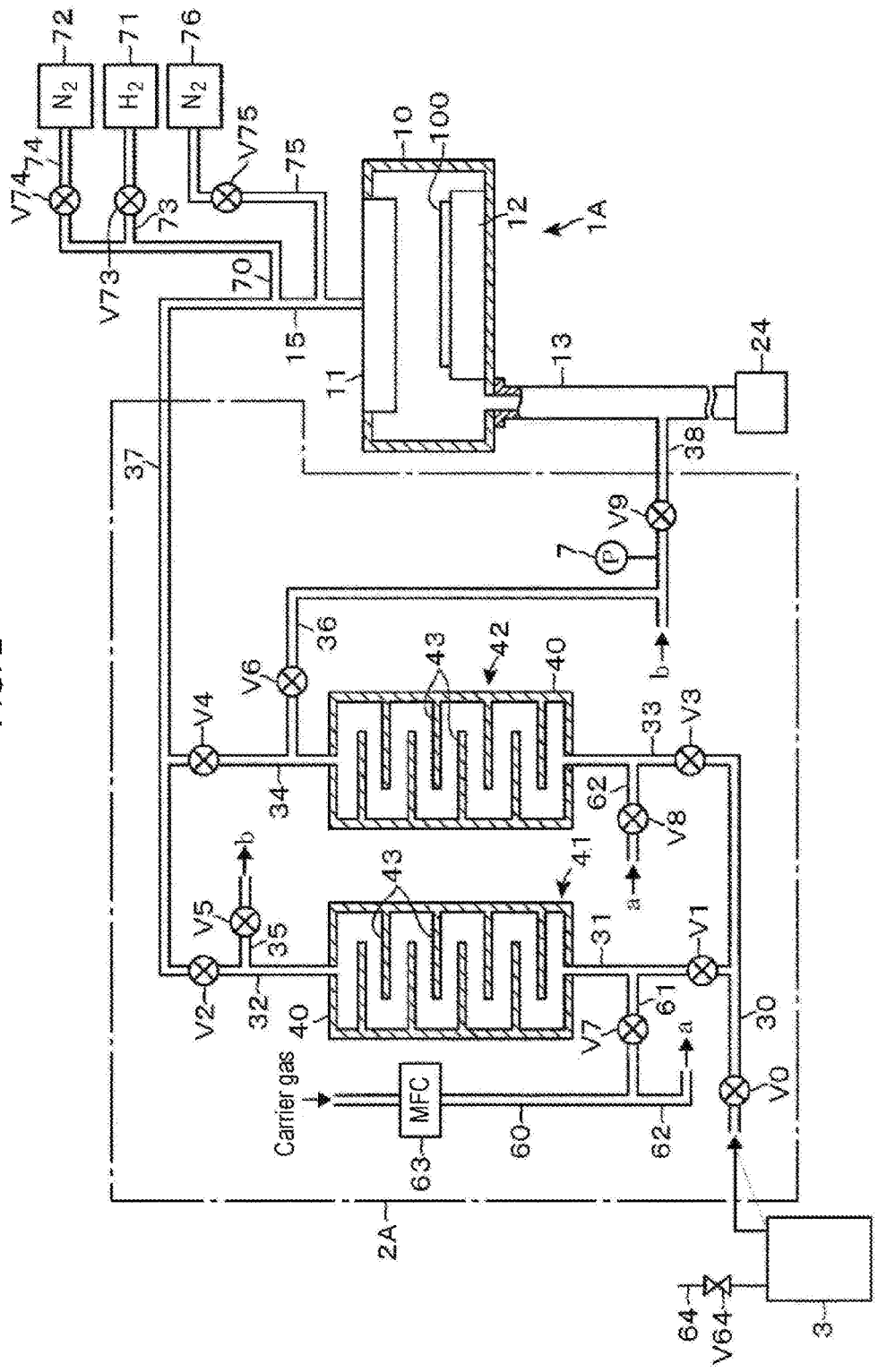
FIG. 2 is a view illustrating a configuration of a raw material supply system installed in the raw material supply apparatus.

Next, among the film forming process parts 1A to 1C and the raw material supply systems 2A to 2C, the film forming process part 1A and the raw material supply system 2A connected thereto will be described by way of representative example. As illustrated in FIG. 2, the film forming process part 1A includes a mounting table 12 configured to horizontally hold a wafer 100 within a vacuum vessel 10 and having a heater (not shown), and a gas introduction part 11 (specifically, a gas shower head) through which the raw material gas or the like is introduced into the vacuum vessel 10. The vacuum vessel 10 is connected to a vacuum exhaust part 24 equipped with a vacuum pump or the like through an exhaust pipe 13 such that the interior of the vacuum vessel 10 is vacuum-exhausted, and a film is formed on a surface of the heated wafer 100 by the raw material gas introduced thereinto.

The gas introduction part 11 is connected to a gas supply pipe 15. The gas supply pipe 15 is joined with a raw material supply pipe 37 as a supply flow path through which the raw material gas containing $WCl_6$ is supplied from the raw material supply system 2A, one end of a reaction gas supply pipe 70 through which a reaction gas that reacts with the raw material gas is supplied, and one end of a substitution gas supply pipe 75 through which a substitution gas is supplied. The other end of the reaction gas supply pipe 70 is branched into a gas supply pipe 73 connected to a reaction gas supply source 71 and a gas supply pipe 74 connected to an inert gas supply source 72 configured to supply an inert gas, for example, a nitrogen ($N_2$) gas. Further, the other end of the substitution gas supply pipe 75 is connected to a substitution gas supply source 76 configured to supply a substitution gas, for example, an $N_2$ gas. In FIG. 2, V73 to V75 are valves respectively installed in the gas supply pipe 73, the gas supply pipe 74, and the substitution gas supply pipe 75.

The raw material supply system 2A includes a first raw material trapping part 41 and a second raw material trapping part 42 which re-solidify and trap the raw material gas which is sublimated inside the raw material vessel 3 and supplied together with the carrier gas. The first and second raw material trapping parts 41 and 42 serve as the raw material supply sources for the film forming process part 1A. Each of the first and second raw material trapping parts 41 and 42 includes a case body 40 made of a material such as a cylindrical stainless steel, and a plurality of plat trapping members 43 each having a solidified surface. In an inner peripheral surface of the case body 40, the plat trapping members 43 formed in a vault shape by cutting a portion of a circle along a line are installed in a shelf fashion (multi-layered structure) in a length direction of the case body 40. Each of the trapping members 43 has a notch formed therein. The notches of the trapping members 43 are formed vertically adjacent to each other to be opposite by 180 degrees. Thus, a crooked flow path having a labyrinth structure is formed within the case body 40.

Figure 3:
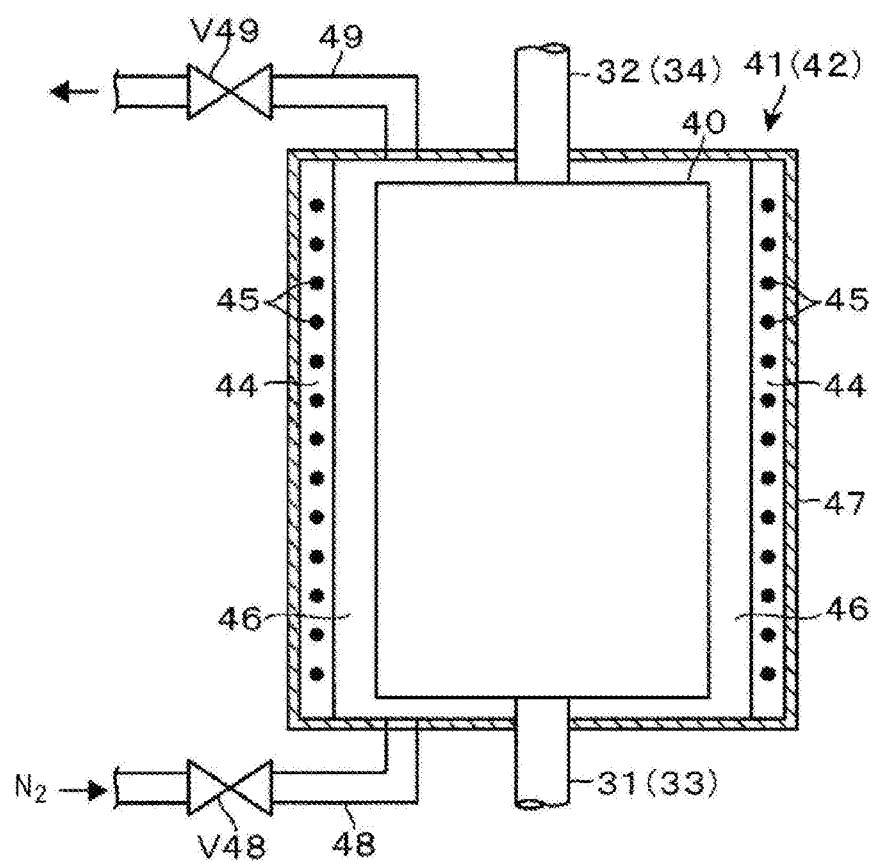
FIG. 3 is a cross-sectional view illustrating a heater and a cooling part which adjust temperatures of first and second raw material trapping parts.

As illustrated in FIG. 3, a cylindrical heater 44 configured to heat the first raw material trapping part 41 (the second raw material trapping part 42) is installed to surround the first raw material trapping part 41 (the second raw material trapping part 42) through a cooling gas flow path 46. The cylindrical heater 44, which serves as a heating part equipped with an electric heating wire 45, heats the raw material trapped by the first raw material trapping parts 41 (the second raw material trapping part 42) to a sublimation temperature or higher.

Further, a cover member 47 is installed to cover an outer side of the heater 44 so that the cooling gas flow path 46 becomes a closed space. The cover member 47 is connected to an $N_2$ gas supply pipe 48 and an $N_2$ gas discharge pipe 49. The $N_2$ gas supply pipe 48 is configured to supply a cooling gas (e.g., an $N_2$ gas) to the cooling gas flow path 46. The cooling gas is used to forcibly cool the first raw material trapping part 41 (the second raw material trapping part 42) to a temperature, which is lower than a solidifying point of $WCl_6$ as a main component of the raw material gas and at which tungsten dichloride dioxide ($WCl_2O_2$) or tungsten tetrachloride oxide ($WCl_4O$) as an impurity included in $WCl_6$ are not solidified. The $N_2$ gas discharge pipe 49 is configured to discharge the $N_2$ gas introduced through the cooling gas flow path 46. Cooling valves V48 and V49 configured to switch supply and cutoff of the cooling gas are respectively installed in the $N_2$ gas supply pipe 48 and the $N_2$ gas discharge pipe 49.

Returning to FIG. 2, one end (or an upstream side) of the case body 40 of the first raw material trapping part 41 in a length direction thereof is connected to a downstream end of one (i.e., a branch pipe 31) of branch pipes 31 and 33 branched from the raw material refilling pipe 30, and one end (or an upstream side) of the case body 40 of the second raw material trapping part 42 in a length direction thereof is connected to a downstream end of the other branch pipe 33. A combination of the raw material refilling pipe 30 and the branch pipes 31 and 33 correspond to a refill flow path. In FIG. 2, V0 is a valve.

In addition, the other end (or a downstream side) of the case body 40 of the first raw material trapping part 41 in the length direction is connected to an upstream end of one (i.e., a branch pipe 32) of branch pipes 32 and 34 branched from the raw material supply pipe 37, and the other end (or a downstream side) of the case body 40 of the second raw material trapping part 42 in the length direction is connected to an upstream end of the other branch pipe 34. Thus, the first raw material trapping part 41 and the second raw material trapping part 42 are connected in parallel with respect to flow paths installed between the raw material vessel 3 and the film forming process part 1A. Valves V1 and V3 are respectively installed in the branch pipes 31 and 33 provided in the upstream sides of the first and second raw material trapping parts 41 and 42, and valves V2 and V4 are respectively installed in the branch pipes 32 and 34 provided in the downstream sides of the first and second raw material trapping parts 41 and 42. A combination of the raw material supply pipe 37 and the branch pipes 32 and 34 correspond to a supply flow path.

Further, in order to supply the raw material gas from each of the first and second raw material trapping parts 41 and 42 to the film forming process part 1A, a carrier gas supply pipe 60 for supplying a carrier gas as an inert gas (e.g., the $N_2$ gas) to each of the first and second raw material trapping parts 41 and 42 is installed in the raw material supply system 2A. The carrier gas supply pipe 60 is branched into pipes 61 and 62. The pipe 61 is connected to a downstream side of the valve V1 in the branch pipe 31, and the pipe 62 is connected to a downstream side of the valve V3 in the branch pipe 33. Further, a mass flow controller (MFC) 63 configured to adjust a flow rate of the carrier gas is installed in the carrier gas supply pipe 60. In FIG. 2, V7 and V8 are valves.

Further, a joint pipe 38 is installed in the raw material supply system 2A to exhaust the gas which passes through the first and second raw material trapping parts 41 and 42 when cooling down the first and second raw material trapping parts 41 and 42. A base end side of the joint pipe 38 is branched into exhaust pipes 35 and 36. The exhaust pipe 35 is connected to an upstream side of the valve V2 in the branch pipe 32, and the exhaust pipe 36 is connected to an upstream side of the valve V4 in the branch pipe 34. Valves V4, V6, and V9 are respectively installed in the exhaust pipes 35 and 36 and the joint pipe 38. In addition, a manometer 7 is installed in the joint pipe 38 to measure an internal pressure of each of the first and second raw material trapping parts 41 and 42 or pressure of the gas exhausted from each of the first and second raw material trapping parts 41 and 42.

Further, the raw material refilling pipe 30 through which the raw material gas passes and the branch pipes 31 and 33 thereof, the raw material supply pipe 37 and the branch pipes 32 and 34 thereof, the exhaust pipes 35 and 36, and the joint pipe 38 are covered with, for example, a tape heater (not shown) or the like. Each of the regions covered with the tape heater is heated to a temperature, e.g., 160 degrees C., at which the raw material gas is not precipitated.

Figure 4:
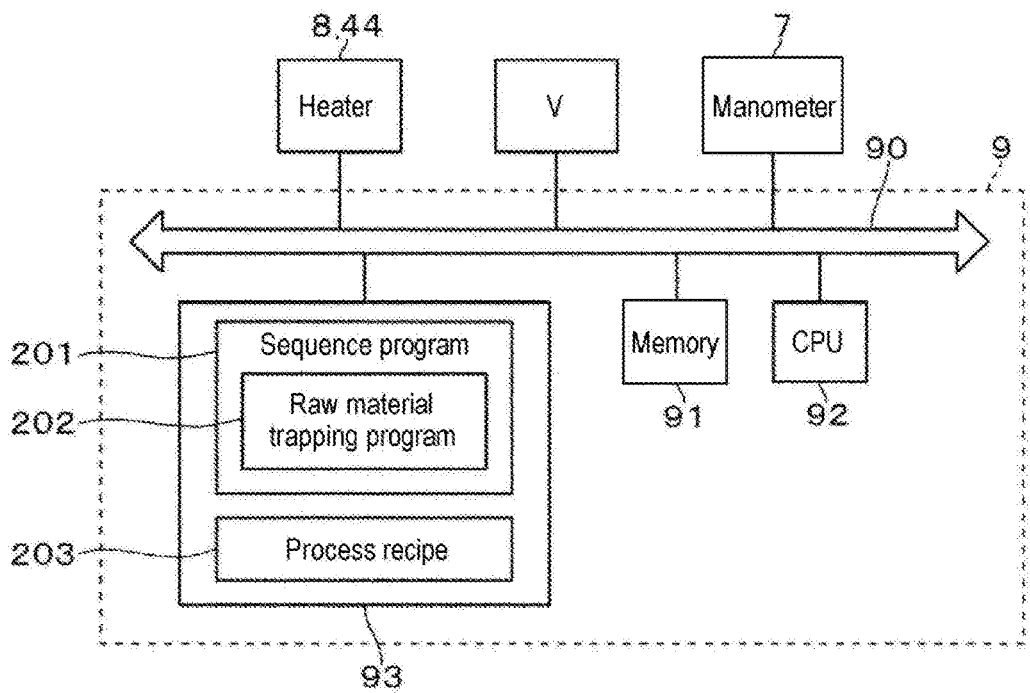
FIG. 4 is a view illustrating a configuration of a control part installed in the raw material supply apparatus.

A control part 9 includes a memory 91, a CPU 92, and a program storage part 93, which are connected to a bus 90. In FIG. 4, the Valve corresponds to a group of valves such as the valve V0 and the like. The program storage part 93 stores a sequence program 201 for performing the supply of the raw material from the raw material vessel 3 to the raw material supply systems 2A to 2C and for performing the supply of the raw material from the raw material supply systems 2A to 2C to the respective film forming process parts 1A to 1C. The raw material supply system 2A and the film formation process part 1A will be described by way of representative example. The sequence program 201 is organized with instructions for performing a procedure of sublimating the raw material stored in the raw material vessel 3 and supplying the same to each of the first and second raw material trapping parts 41 and 42 where the sublimated raw material is trapped, and a procedure of sublimating the raw material trapped by each of the first and second raw material trapping parts 41 and 42 and supplying the same into the vacuum vessel 10. Further, a process recipe 203 is organized with instructions for performing a film forming process using the ALD method in this embodiment.

In FIG. 4, a raw material trapping program 202 constitutes a part of the sequence program 201 and is organized with instructions for performing a procedure of sublimating the raw material stored in the raw material vessel 3 and supplying the same to each of the first and second raw material trapping parts 41 and 42 where the sublimated raw material is trapped. The raw material trapping program 202 includes instructions of: allowing the raw material transmitted from the raw material vessel 3 to be trapped by each of the first and second raw material trapping parts 41 and 42; obtaining an increase in amount of the trapped raw material; obtaining an amount of the trapped raw material per unit time (a trapping rate of the raw material) based on the obtained increase and a given period of time; calculating a period of time required to reach a target trapping value from the obtained trapping rate. A method of measuring a trapped amount of the raw material using the instructions and the first and second raw material trapping parts 41 and 42 will be described in detail, in relation to operations described later.

An operation of the foregoing embodiment will be described. First, the film forming apparatus equipped with the raw material supply apparatus according to the present disclosure will be described using the raw material supply system 2A as an example with reference to FIGS. 5 to 7. Prior to describing the present disclosure, it is assumed that an operation of the film forming apparatus of performing the film forming process has been initiated, and the solid raw material 300 stored in the raw material vessel 3 has not been consumed and has not been trapped by the first and second raw material trapping parts 41 and 42. First, the heater 8 of the raw material vessel 3 is turned on to heat the raw material vessel 3 to, e.g., 150 degrees C., so that the solid raw material 300 is thus vaporized (sublimated). In this way, a concentration of a raw material within the raw material vessel 3 is increased up to a concentration close to a saturation level. Also, the heater 44 is turned on to heat the first raw material trapping part 41 to, e.g., 60 degrees C. Further, when the film forming apparatus is started up and an initial operation is initiated, the raw material may be trapped by both the first raw material trapping part 41 and the second raw material trapping part 42, but the following description will be made on the assumption that the raw material is trapped by only the first raw material trapping part 41.

Figure 5:
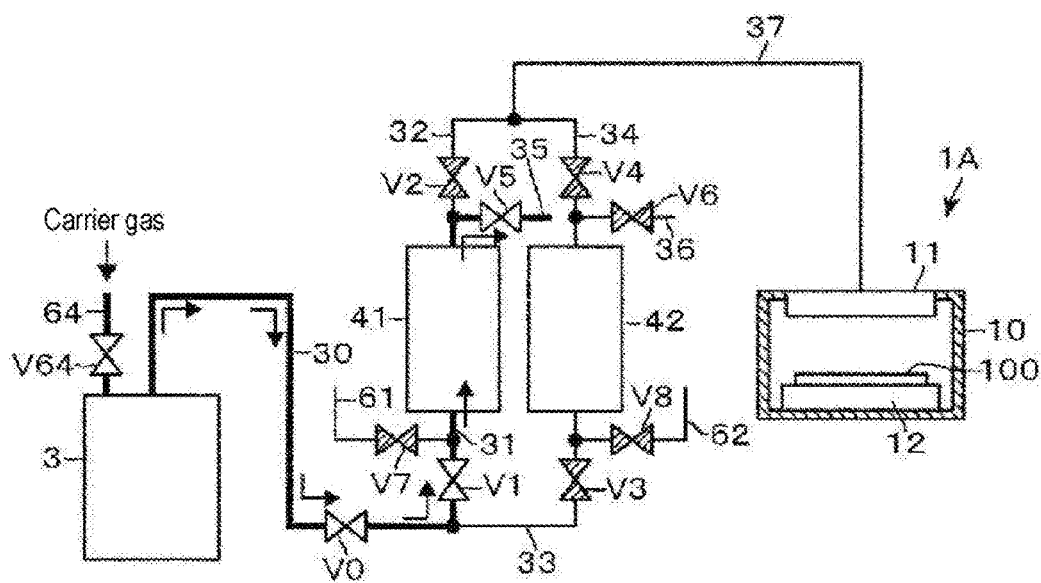
FIG. 5 is an explanatory view illustrating an operation of the raw material supply apparatus according to an embodiment of the present disclosure.

Subsequently, as illustrated in FIG. 5, the valves V0, V1, V5, and V9 are opened, and the valve V64 is also opened to supply the carrier gas into the raw material vessel 3. Then, the raw material which has been sublimated and saturated within the raw material vessel 3 is supplied together with the carrier gas into the case body 40 of the first raw material trapping part 41 through the raw material refilling pipe 30 and the branch pipe 31. The gas which passes through the case body 40 is discharged through the branch pipe 32 and subsequently, is exhausted from the exhaust pipe 13 illustrated in FIG. 2 through the exhaust pipe 35.

An internal temperature of the case body 40 of the first raw material trapping part 41 is set to 60 degrees C., lower than a solidifying point of $WCl_6$ as the raw material. As such, when the raw material which is in a gas phase passes through the crooked path as a labyrinth formed by the multi-layered trapping members 43, the raw material is trapped and precipitated (re-solidified) on the trapping members 43 and an inner surface of the case body 40 so that $WCl_6$ adheres to the surfaces of the trapping members 43 in the form of a thin film. In the first raw material trapping part 41, a size of the case body 40 or a vertical interval between the trapping members 43, the number of layers of the trapping members 43 and the like are set such that, when the raw material gas containing the carrier gas and the raw material pass through the first raw material trapping part 41, almost all of the raw material of the raw material gas is trapped (re-solidified).

Here, a solid raw material of $WCl_6$ available in the marketplace generally includes a small amount of $WCl_2O_2$ or $WCl_4O$ in addition to $WCl_6$. Since $WCl_6$ has a solidifying point higher than 60 degrees C., $WCl_6$ is re-solidified when being cooled at 60 degrees C. $WCl_2O_2$ and $WCl_4O$ have a solidifying point lower than 60 degrees C., and thus, they are not solidified at 60 degrees C. Because of this, a temperature of the first raw material trapping part 41 is set to 60 degrees C. In this state, when the raw material gas passes through the first raw material trapping part 41 to re-solidify the same, $WCl_6$ is precipitated in the first raw material trapping part 41, while $WCl_2O_2$ or $WCl_4O$ passes through the first raw material trapping part 41 as it is and is exhausted together with the carrier gas.

When an amount of the raw material precipitated in the first raw material trapping part 41 is, e.g., 400 g, the valve V1 is closed. A timing at which a preset amount of the raw material is precipitated in the first raw material trapping part 41 is controlled based on, for example, a period of time for which the raw material gas flows into the first raw material trapping part 41. In this manner, the first raw material trapping part 41 is properly prepared as a raw material supply source for the film forming process part 1A. Subsequently, the wafer 100 is mounted on the mounting table 12 in the film forming process part 1A and the interior of the vacuum vessel 10 is vacuum-exhausted so that the wafer 100 is heated. Thereafter, the film forming process is performed using, e.g., the ALD method. The supply of the raw material gas is performed in the following manner. First, before initiating the film forming process, the heater 44 of the first raw material trapping part 41 is turned on to increase the internal temperature of the case body 40 to a temperature ranging from 150 to 200 degrees C. as a set temperature, e.g., up to 200 degrees C., thus sublimating the raw material precipitated in the first raw material trapping part 41 as described above. Subsequently, the valve V7 is opened to supply the carrier gas to the first raw material trapping part 41 so that a raw material gas as a mixture of the sublimated raw material and the carrier gas is exhausted from the first raw material trapping part 41 by the vacuum exhaust part 24 while bypassing the film forming process part 1A. The ALD method is to alternately supply the raw material gas and the reaction gas as described above. In order to stabilize a concentration of the raw material in the raw material gas before performing a sequence of intermittent supply operations of the raw material gas, the raw material gas is exhausted from the first raw material trapping part 41 for a predetermined period of time as described above. Thereafter, the valve V5 is closed and the valve V2 is opened so that the supply of the raw material to the film forming process part 1A is initiated.

An example of using the first raw material trapping part 41 as the raw material supply source in the film forming process performed by the film forming process part 1A will be described. First, the raw material gas and the carrier gas are supplied into the vacuum vessel 10 for, e.g., 1 second, and the valve V2 is closed so that $WCl_6$ is adsorbed to a surface of the wafer 100. Subsequently, the valve V75 is opened to supply the substitution gas (the $N_2$ gas) into the vacuum vessel 10, thus substituting an internal atmosphere of the vacuum vessel 10. Subsequently, the valve V75 is closed and the valves V73 and V74 are opened to supply the reaction gas (the $H_2$ gas) into the vacuum vessel 10 together with the dilution gas (the $N_2$ gas), thus reducing $WCl_6$ adsorbed to the surface of the wafer 100 by the $H_2$ gas. In this way, a W film of one atomic layer is formed on the surface of the wafer 100. Thereafter, the valves V73 and V74 are closed and the valve V75 is opened to supply the substitution gas into the vacuum vessel 10, thus substituting the internal atmosphere of the vacuum vessel 10. In this manner, by controlling the turn-on/turn-off operations of the valves V2, V73, V74, and V75, a cycle of supplying a series of the raw material gas containing $WCl_6 \rightarrow$ the substitution gas $\rightarrow$ the reaction gas $\rightarrow$ the substitution gas into the vacuum vessel 10 is repeated a plurality number of times to form the W film having a predetermined thickness. Upon completion of the film forming process, the wafer 100 is unloaded from the film forming apparatus.

Meanwhile, while the first raw material trapping part 41 is used as the raw material supply source (primary raw material supply source), the valves V3 and V6 are opened to refill the raw material into the second raw material trapping part 42 as illustrated in FIG. 6. Such a refilling process is performed in the same manner as that of refilling the raw material into the first raw material trapping part 41. Further, for example, one lot (e.g., 25 sheets) of wafers 100 are processed using the first raw material trapping part 41 as the raw material supply source, and thereafter, the valves V2 and V7 are closed to stop the supply of the raw material gas to the film forming process part 1A from the first raw material trapping part 41 as illustrated in FIG. 7. And, in performing the film forming process on a subsequent lot (25 sheets) of wafers 100, the valves V3 and V6 are closed and the valves V4 and V8 are opened so that the second raw material trapping part 42 is used as a secondary raw material supply source.

Figure 8:
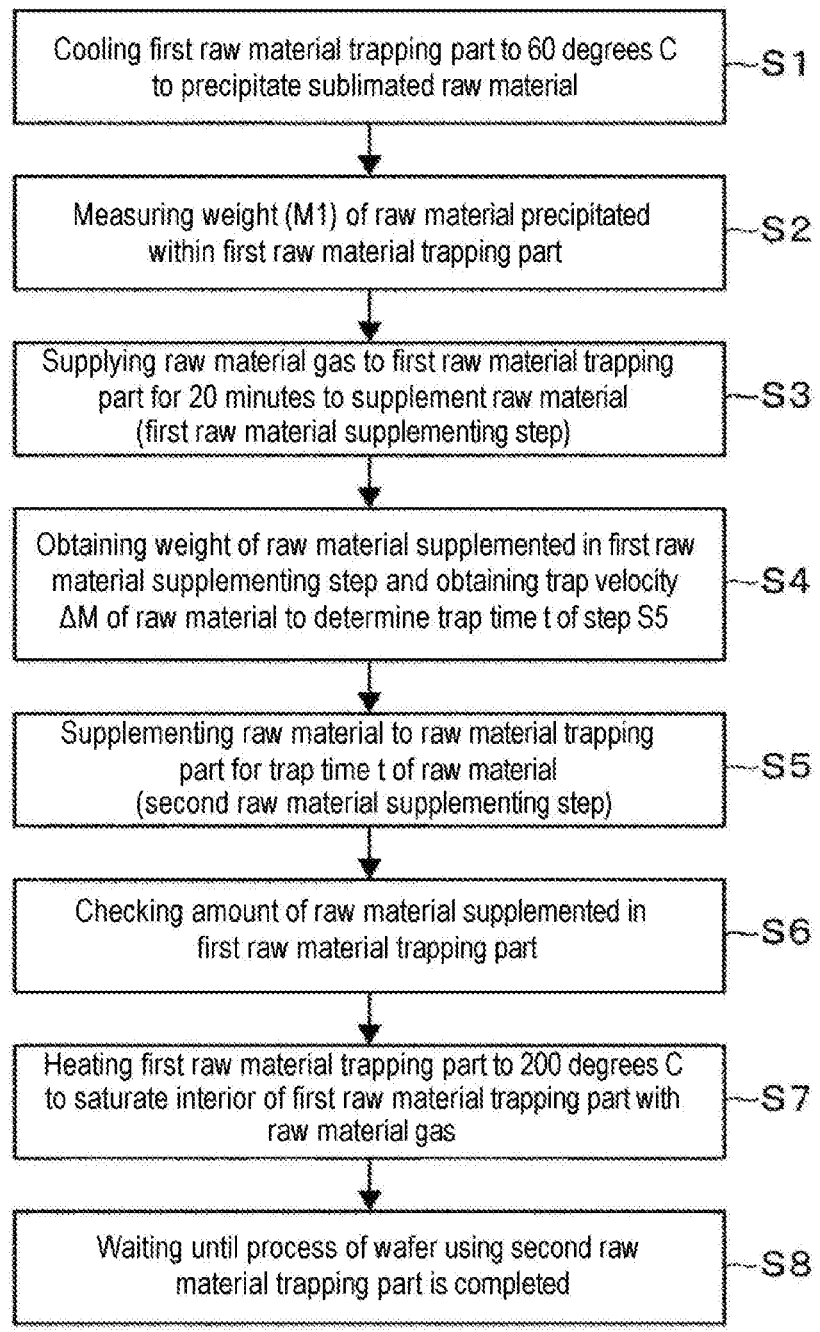
FIG. 8 is a flowchart illustrating a process of refilling a raw material according to an embodiment of the present disclosure.

A process of refilling the raw material into the first raw material trapping part 41 used as the primary raw material supply source, while the second raw material trapping part 42 is used as the secondary raw material supply source, will be described. FIG. 8 is a flowchart illustrating a process of refilling the raw material into the first raw material trapping part 41. It is assumed that, for example, 400 g of the raw material is charged in the first raw material trapping part 41 before initiating the film forming process for the wafer 100. Further, assuming that, for example, 13 g of the raw material is used to perform the film forming process on one sheet of the wafer 100, a total of 325 g of the raw material is consumed in processing one lot (25 sheets) of the wafers 100.

As illustrated in FIG. 7, immediately after the first raw material trapping part 41 is used as the primary raw material gas supply source, the valves V1, V7, V2 and V5 respectively installed in the branch pipe 31, the pipe 61, the branch pipe 32, and the exhaust pipe 35 which are connected to the first raw material trapping part 41 are closed to be in a closed state. Further, since the first raw material trapping part 41 has been heated to 200 degrees C., the raw material gas has been sublimated and saturated within the first raw material trapping part 41. Thus, before the raw material within the raw material vessel 3 is trapped in the first raw material trapping part 41, the first raw material trapping part 41 is first cooled down to, e.g., 60 degrees C. in step S1 illustrated in FIG. 8. Thus, the raw material gas sublimated within the first raw material trapping part 41 is precipitated (re-solidified) in an inner wall of the first raw material trapping part 41 or on the surfaces of the trapping members 43.

Subsequently, in step S2, while the first raw material trapping part 41 is maintained at 60 degrees C., a weight M1 of the raw material precipitated in the first raw material trapping part 41 is measured by a build-up method. The build-up method is applied in measuring the weight of the raw material precipitated in the first raw material trapping part 41, i.e., an amount (charge amount) of the trapped raw material in the first raw material trapping part 41, in addition to step S2.

Figure 9:
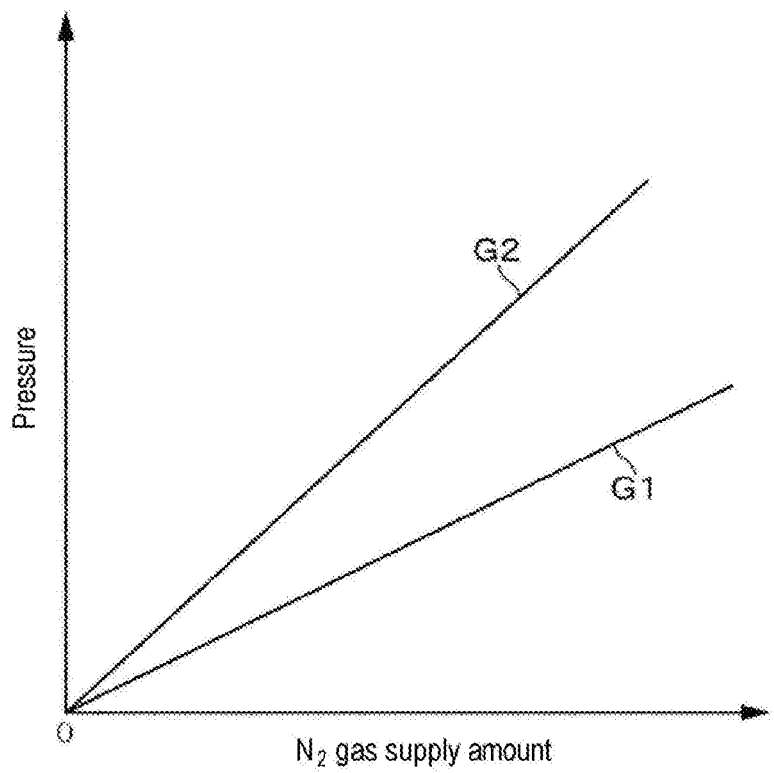
FIG. 9 is a characteristic graph illustrating a relationship between a supply amount of an $N_2$ gas and a pressure in a build-up method.

Now, the build-up method will be described. When a raw material is precipitated within a sealed vessel, an internal gas phase volume of the vessel is reduced by the volume of the precipitated raw material. Pressure when a gas is supplied at a constant flow velocity into a vacuum vessel at a fixed temperature follows Boyle's law, and thus, it is inversely proportional to the volume. Thus, in a state where a raw material is not precipitated within the vessel, when an $N_2$ gas is supplied into the vessel, a relationship between a supply amount of the $N_2$ gas and an internal pressure of the vessel is manifested as a graph G1 in FIG. 9. In contrast, a relationship between the supply amount of the $N_2$ gas and the internal pressure of the vessel when a gas (e.g., the $N_2$ gas) is supplied into the vessel after precipitating the raw material within the vessel is manifested as a graph G2 in FIG. 9. Specifically, since the internal gas phase volume is reduced by a volume of the precipitated raw material, the slope of the graph is increased. Further, since the pressure and the supply amount of the $N_2$ gas are known, it is possible to calculate the internal gas phase volume of the vessel using the slope of the graph.

Thus, the volume of the raw material precipitated within the vessel is obtained based on a difference between the internal gas phase volume of the vessel when the raw material is not precipitated within the vessel and the internal gas phase volume of the vessel when the raw material is precipitated within the vessel. Further, based on the obtained volume of the raw material, a density of the raw material is checked in advance, thus calculating a weight of the precipitated raw material. On this account, obtaining the volume of the raw material may be considered to be the same as measuring the weight of the raw material. Therefore, the manometer 7 constitutes a measurement part configured to measure an amount of the trapped raw material.

Figure 10:
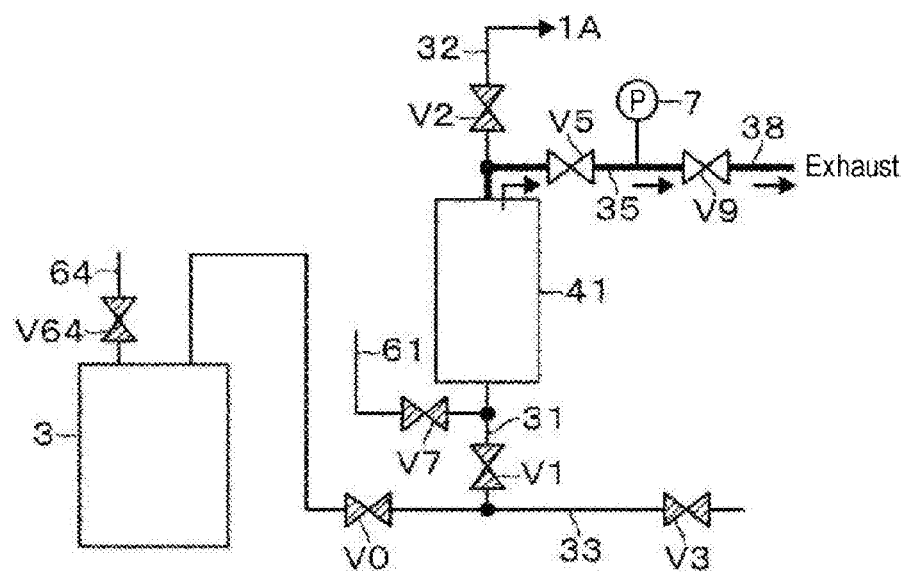
FIG. 10 is an explanatory view illustrating an operation of the raw material supply apparatus according to an embodiment of the present disclosure.
Figure 11:
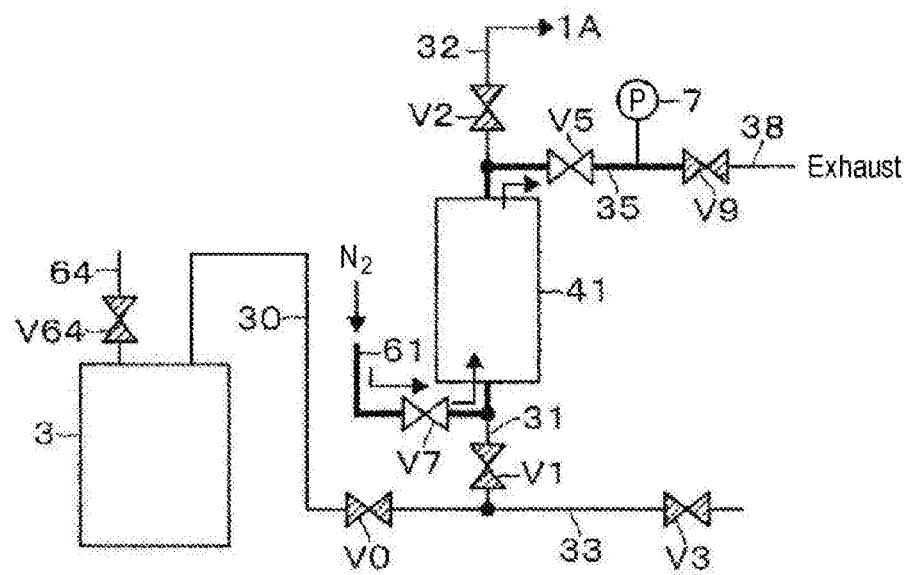
FIG. 11 is an explanatory view illustrating an operation of the raw material supply apparatus according to an embodiment of the present disclosure.

Accordingly, returning to the flowchart of FIG. 8, in step S2, first, as illustrated in FIG. 10, the valves V5 and V9 are opened such that the first raw material trapping part 41 is vacuum-exhausted to reach up to a predetermined pressure. Subsequently, as illustrated in FIG. 11, the valve V9 is closed and the valve V7 is opened for a predetermined period of time to supply a predetermined flow rate of the $N_2$ gas into the first raw material trapping part 41. And, a change in pressure after the supply of the $N_2$ gas is initiated is monitored by the manometer 7 installed in the upstream side of the valve V9 using the build-up method, thus obtaining a transition data of pressure. Further, for example, a relationship between a slope of the transition data of pressure and an internal volume of the first raw material trapping part 41 is stored as a table in the memory 91 in advance. Based on the slope of the obtained transition data of pressure and the table, the internal volume of the first raw material trapping part 41, that is to say, an internal gas phase volume of the first raw material trapping part 41 is obtained.

Thereafter, a difference between an internal gas phase volume of the first raw material trapping part 41 in a state where the interior of the first raw material trapping part 41 is empty (in a state where an amount of the trapped raw material is zero), which has been obtained in advance, and the internal gas phase volume of the first raw material trapping part 41 calculated in step S2, is calculated. Accordingly, a volume of the raw material precipitated in the first raw material trapping part 41, i.e., a volume of the raw material remaining after one lot (25 sheets) of the wafers 100 are processed, can be obtained. Further, by multiplying the density of $WCl_6$ as the raw material to the volume of the remaining raw material, a residual amount (weight) M1 of the raw material within the first raw material trapping part 41 at the time of completing the film forming process for one lot of the wafers 100 can be obtained.

Figure 12:
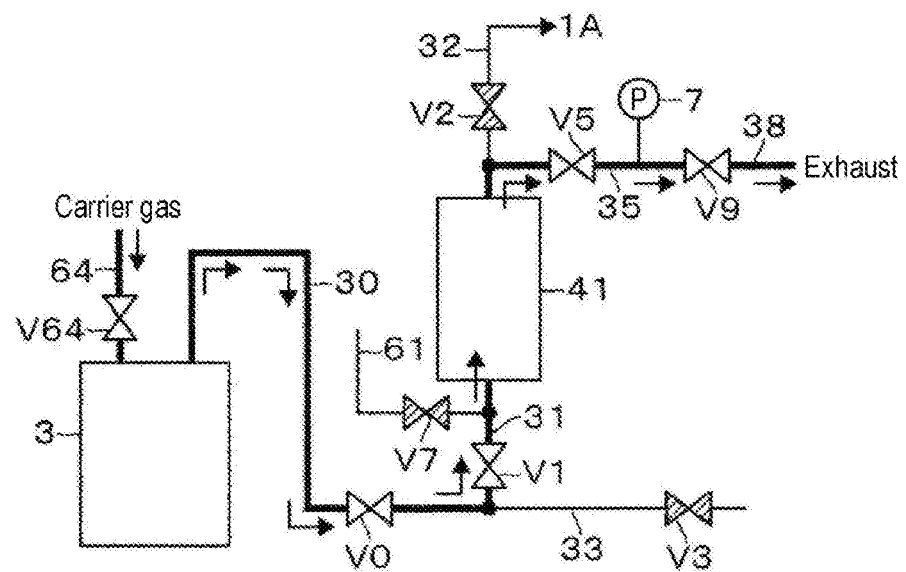
FIG. 12 is an explanatory view illustrating an operation of the raw material supply apparatus according to an embodiment of the present disclosure.

Subsequently, in step S3, a first raw material refilling process in which the raw material is refilled into the first raw material trapping part 41 where the raw material is trapped, is performed. As illustrated in FIG. 12, in step S3, the valves V0, V1, V9, and V64 are opened to supply the carrier gas into the raw material vessel 3. Then, the raw material which has been sublimated and saturated within the raw material vessel 3 are supplied together with the carrier gas to the first raw material trapping part 41 through the raw material refilling pipe 30 and the branch pipe 31. The gas which passes through the first raw material trapping part 41 is exhausted from the exhaust pipe 13 illustrated in FIG. 2 through the branch pipe 32, the exhaust pipe 35, and the joint pipe 38. Since the first raw material trapping part 41 is maintained at 60 degrees C., the raw material supplied from the raw material vessel 3 is precipitated and trapped in the first raw material trapping part 41. Thereafter, after a predetermined period of time (e.g., 20 minutes) from a time at which the supply of the raw material gas to the first raw material trapping part 41 is initiated, the valves V0, V1, and V64 are closed.

Subsequently, as described in step S4, the internal gas phase volume of the first raw material trapping part 41 is measured, and a difference between the measured volume and the previously-obtained internal gas phase volume of the first raw material trapping part 41 in a state where the raw material is not precipitated is obtained. This difference corresponds to a volume of the raw material trapped in the first raw material trapping part 41 through the first raw material refilling process. Thus, by multiplying the density of the raw material ($WCl_6$) to the volume of the raw material, it is possible to obtain a weight M2 of the trapped raw material after completing the first raw material refilling process.

Further, a weight of the raw material refilled in the first raw material refilling process in step S3 is calculated as a difference (M2−M1) between the weight M2 of the trapped raw material at the time of completing the first raw material refilling process and the weight M1 calculated in step S2. In addition, by dividing the weight (M2−M1) of the raw material precipitated in step S4 by 20 minutes as a time duration during which the raw material was precipitated in step S3, it is possible to obtain a weight of the trapped raw material per unit time (a trapping rate of the raw material) ΔM (=(M2−M1)/20 min)) in the first raw material trapping part 41.

Thereafter, a difference between a target weight (e.g., 400 g) of the raw material and the weight M2 of the trapped raw material at the time of completing the first raw material refilling process is divided by the trapping rate ΔM of the raw material so as to determine a period of trapping time (refilling time) (t) ((400−M2)/ΔM) for which the raw material gas is trapped in a second raw material refilling process performed in a subsequent step S5.

Subsequently, in step S5, the second raw material refilling process of refilling the raw material is performed with respect to the first raw material trapping part 41. In step S5, the valves V0, V1, V9, and V64 are opened for the period of trapping time (t) of the raw material gas obtained in step S4 such that the raw material is trapped in the first raw material trapping part 41. Thus, in step S5, the raw material of ΔM×t=ΔM×(400−M2)/ΔM=400−M2 is refilled. Since M2 is the weight of the trapped raw material at the time of completing the first raw material refilling process, a weight of the trapped raw material at the time of completing the second raw material refilling process is 400 g which corresponds to the computational target value of the trapped amount.

Thereafter, in step S6, it is checked whether the weight of the trapped raw material at the time of completing the second raw material refilling process reaches the target value. Also, the target value in this case means to include an allowable range of the target vale. In some embodiments, if the weight of the trapped raw material at the time of completing the second raw material refilling process is smaller than the target value, before proceeding to step S7, the valves V0, V1, V9, and V64 may be opened for, e.g., a period of time obtained by multiplying the trapping rate ΔM of the raw material to a shortfall, thus allowing the shortfall of the raw material to be trapped. Alternatively, if an amount of the raw material supplied from the raw material vessel 3 is determined to be too small, any further operation may be stopped and a cause thereof may be examined.

Meanwhile, if it is determined that the weight of the raw material trapped in the first raw material trapping part 41 reaches the target value, the process goes to step S7 where the first raw material trapping part 41 is heated to 200 degrees C. Thus, the raw material precipitated in the first raw material trapping part 41 is sublimated such that the interior of the first raw material trapping part 41 is saturated with the raw material gas. Thereafter, in step S8, in a state where the first raw material trapping part 41 is heated, it waits until the film forming process of the wafer 100 using the second raw material trapping part 42 as the secondary raw material supply source is completed.

Figure 13:
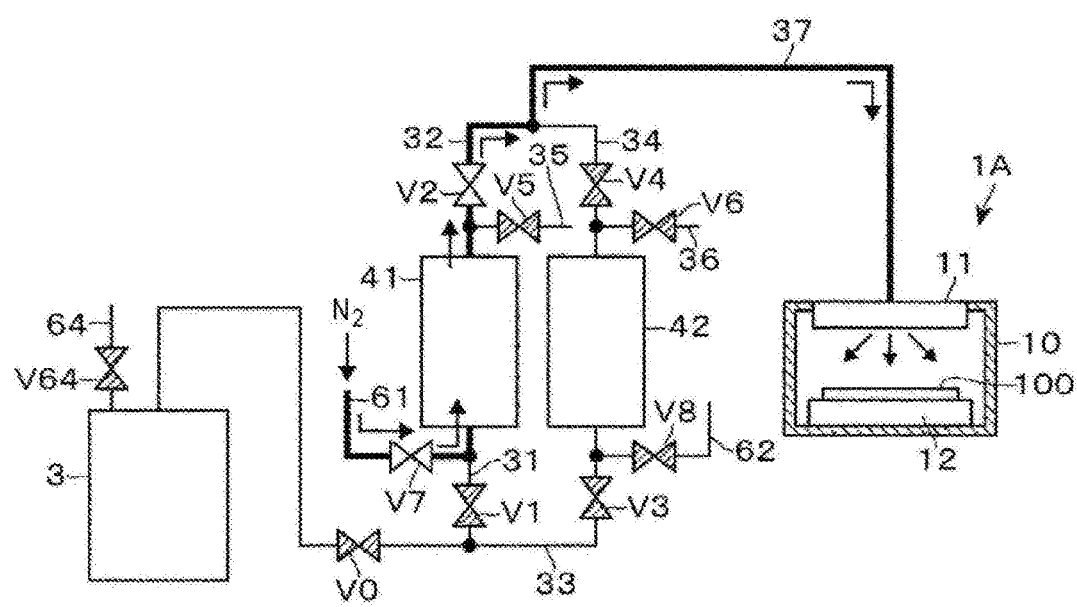
FIG. 13 is an explanatory view illustrating an operation of the raw material supply apparatus according to an embodiment of the present disclosure.

Upon completion of the film forming process of one lot (e.g., 25 sheets) of the wafers 100, which is performed using the second raw material trapping part 42 as the secondary raw material supply source, as illustrated in FIG. 13, the valves V4 and V8 are closed to stop the supply of the raw material gas from the second raw material trapping part 42 to the film forming process part 1A. Further, in order to process a subsequent lot (e.g., 25 sheets) of the wafers 100, the valves V2 and V7 are opened and the first raw material trapping part 41 is used as the primary raw material supply source again. Also, while the first raw material trapping part 41 is used as the primary raw material supply source, the raw material is refilled into the second raw material trapping part 42 according to the flowchart of FIG. 8 in the same manner.

As described above, the process of refilling the raw material from the raw material vessel 3 into the second raw material trapping part 42 while using the first raw material trapping part 41 as the primary raw material supply source for the film forming process part 1A, and the process of refilling the raw material from the raw material vessel 3 into the first raw material trapping part 41 while using the second raw material trapping part 42 as the secondary raw material supply source for the film forming process part 1A are alternately repeated. That is to say, the first raw material trapping part 41 and the second first raw material trapping part 42 are alternately used as the raw material supply sources. Further, the raw material supply systems 2B and 2C illustrated in FIG. 1 supplies the raw material gas to the film forming process parts 1B and 1C in a manner analogous to that described above.

According to the foregoing embodiment, the first and second raw material trapping parts 41 and 42 used as the raw material supply sources for supplying the raw material to the film forming process part 1A precipitate the raw material on the wall surface of the case body 40 or on the surfaces of the trapping members 43 in the form of a thin film, and heat the entire wall surface and the trapping members 43. In the raw material vessel 3, as described in the BACKGROUND, the supply amount of the raw material may be reduced as the solid raw material 300 is reduced. Thus, the precipitation of the raw material in the form of a thin film allows the entire thin film of the raw material to be uniformly heated, which stabilizes an amount of sublimation of the raw material, thus stabilizing the supply amount of the raw material to the film forming process part 1A.

In addition, in a case in which the film forming process for the wafers 100 is repeated while switching the first and second raw material trapping parts 41 and 42, the raw material supplied to the first raw material trapping part 41 (the second raw material trapping part 42) may be reduced as the solid raw material 300 charged in the raw material vessel 3 is reduced. This destabilizes a trapped amount of the raw material refilled into the first raw material trapping part 41 (the second raw material trapping part 42). And, since the trapped amount of the raw material refilled into the first raw material trapping part 41 (the second raw material trapping part 42) is destabilized, there is a possibility that an amount of the raw material supplied to the consumption area fluctuates. In the foregoing embodiment, in refilling the raw material into the first raw material trapping part 41 (the second raw material trapping part 42), the trapping time period of the raw material in the second raw material refilling process is determined based on the amount (charge amount) of the trapped raw material per unit time in the first raw material refilling process so that an amount of the raw material refilled into the first raw material trapping part 41 (the second raw material trapping part 42) is adjusted to be uniform. On this account, when the film forming process for each lot of the wafers 100 is initiated, the weight of the raw material trapped in the first raw material trapping part 41 (the second raw material trapping part 42) is uniform, and thus, an amount of a raw material supplied to the wafers 100 in each lot is stabilized in performing the film forming process for the wafers 100.

Further, in the above embodiment, when the raw material supply apparatus is first used, or when the solid raw material 300 stored in the raw material vessel 3 is first used and also the first and second raw material trapping parts 41 and 42 are first used after maintenance of the raw material supply apparatus, a supply time period of the raw material from the raw material vessel 3 is set to a constant period of time corresponding to 400 g which is the target value. Thus, an amount of the raw material trapped in the first raw material trapping part 41 (the second raw material trapping part 42) at the time of initiating a film forming process for an initial wafer 100 is 400 g as the target value. When the raw material stored in the raw material vessel 3 starts to be consumed, since an amount of the solid raw material 300 is large so that an amount of sublimation is stable, and thus, the amount of the raw material trapped in the first raw material trapping part 41 (the second raw material trapping part 42) is uniform. On this account, even though the trapped amount of the raw material trapped in the first raw material trapping part 41 (the second raw material trapping part 42) is managed by a period of time for which gas flows into the first raw material trapping part 41 (the second raw material trapping part 42), a deviation of the trapped amount to the target value is small. In some embodiments, even in starting the operation of the raw material supply apparatus, the raw material may be refilled by performing the first raw material refilling process, followed by determining the period of trapping time of the raw material in the second raw material refilling process based on the measured amount of the trapped raw material, according to the flowchart of FIG. 8.

Further, when the temperature of the first raw material trapping part 41 (the second raw material trapping part 42) is set to 60 degrees C. and the raw material is supplied to the first raw material trapping part 41 (the second raw material trapping part 42) where the raw material is trapped, $WCl_6$ is precipitated in the first raw material trapping part 41 (the second raw material trapping part 42), while $WCl_2O_2$ passes directly through the first raw material trapping part 41 (the second raw material trapping part 42) and is exhausted by the vacuum exhaust part 24. Thus, by cooling down the first raw material trapping part 41 (the second raw material trapping part 42) at 60 degrees C. to precipitate the raw material, followed by heating the first raw material trapping part 41 (the second raw material trapping part 42) to 150 to 200 degrees C., followed by supplying the raw material gas to the film forming process part 1A, it is possible to supply the $WCl_6$ gas with higher purity to the film forming process part 1A.

In some embodiments, as the solid raw material 300 supplemented into the raw material vessel 3, $WCl_6$ with higher purity may be used in advance. In case of using the $WCl_6$ with higher purity, for example, a temperature when a raw material is trapped in the first raw material trapping part 41 (the second raw material trapping part 42) may be set to a temperature lower than 60 degrees C., e.g., 23 degrees C., thus increasing a trapping efficiency of the raw material.

In some embodiments, in order to effectively precipitate $WCl_6$ in the first raw material trapping part 41 (the second raw material trapping part 42) or in order not to precipitate $WCl_2O_2$ or $WCl_4O$ therein, an internal pressure of the case body 40 or a flow rate of a gas may be adjusted, without being limited to the setting of the cooling temperature of the case body 40 to 60 degrees C.

Also, in step S4, an amount of the carrier gas supplied to the raw material vessel 3 may be corrected based on the measured trapping rate $\Delta M$ of the raw material. When the supply amount of the carrier gas is uniform, a flow rate of the raw material transmitted from the raw material vessel 3 is reduced as the solid raw material 300 is consumed. And, as a residual amount of the solid raw material 300 is reduced, a degree of lowering of the flow rate of the raw material is increased. Thus, if the residual amount of the solid raw material 300 is considerably reduced, the flow rate of the raw material is also drastically lowered. Macroscopically, the flow rate of the raw material is lowered with the consumption of the solid raw material 300 within the raw material vessel 3, but while the raw material is trapped in the first raw material trapping part 41 (the second raw material trapping part 42), the flow rate of the raw material is not remarkably changed.

On this account, when the flow rate of the raw material is smaller than a preset flow rate as the raw material is repeatedly trapped in the first and second raw material trapping parts 41 and 42, i.e., when the trapping rate ΔM of the raw material described above is lower than a preset velocity, a flow rate of the carrier gas to be supplied into the raw material vessel 3 is corrected. In this case, the correction of the flow rate of the carrier gas may be performed at a certain time interval, rather than in real time. Specifically, for example, a method of increasing the flow rate of the carrier gas by a predetermined amount may be employed as the correction method. Since the flow rate of the carrier gas is corrected in this manner, it is possible to prevent the time required to trap the raw material in the first raw material trapping part 41 (the second raw material trapping part 42) from being lengthened.

Further, the trapping rate ΔM of the raw material corresponds to an amount of the raw material supplied from the raw material vessel 3, and thus, corresponds to a sublimation amount of the solid raw material 300 within the raw material vessel 3. Also, the sublimation amount of the solid raw material 300 within the raw material vessel 3 corresponds to a residual amount of the solid raw material 300 within the raw material vessel 3. Thus, the residual amount of the solid raw material 300 within the raw material vessel 3 can be estimated by measuring the trapping rate ΔM of the raw material. Accordingly, a timing at which the raw material vessel 3 is to be exchanged may be determined based on the trapping rate ΔM of the raw material.

Further, for example, when the solid raw material 300 within the raw material vessel 3 is smaller than a preset amount, the raw material vessel 3 may be replaced while the raw material gas is supplied from the first raw material trapping part 41 or the second raw material trapping part 42 in each of the raw material supply systems 2A to 2C to the respective film forming process parts 1A to 1C.

Also, for example, the raw material precipitated in the first raw material trapping part 41 (the second raw material trapping part 42) may be measured by calculating a weighing capacity of the first raw material trapping part 41 (the second raw material trapping part 42). This method may be performed by modifying structures of the pipes connected to the upstream and downstream sides of each of the first and second raw material trapping parts 41 and 42 to bellows structures such that each of the first and second raw material trapping parts 41 and 42 is moved up and down, and supporting a horizontal protrusion installed in each of the first and second raw material trapping parts 41 and 42 by, for example, a weight scale. Further, the present disclosure may be used in a film forming apparatus based on a CVD method.

Also, the configurations of the first and second raw material trapping parts 41 and 42 are not limited to those illustrated in the foregoing embodiment. As an example, each of the first and second raw material trapping parts 41 and 42 may have a configuration in which a hollow pipe of a hexagonal column shape is installed inside the case body 40 while being arranged to extend in a length direction of the case body 40 in parallel with the case body 40. That is to say, the hollow pipe has a honeycomb shape when viewed in the length direction of the case body 40. This configuration increases an inner surface area of the case body 40, which provides the same effects as the above embodiment.

Further, in some embodiments, a nozzle may be installed inside the raw material vessel 3 to inject the carrier gas supplied through the carrier gas supply path 64 at a flow rate of, e.g., about 10 slm, toward the solid raw material 300. Sublimation of the solid raw material 300 becomes active as the carrier gas is injected to the surface of the solid raw material 300, that is to say, as the raw material in the vicinity of the surface is constantly substituted with the carrier gas. When the flow rate of the carrier gas is, e.g., about 100 to 1000 sccm, a difference in flow velocity of the carrier gas in the vicinity of the surface of the solid raw material 300 is significant when the first raw material trapping part 41 (the second raw material trapping part 42) is fully charged with the raw material and when the residual amount of the solid raw material 300 is small. This destabilizes a concentration of the raw material. Thus, by increasing the flow rate of the carrier gas and the flow velocity thereof, an amount of the raw material supplied from the raw material vessel 3 to the first raw material trapping part 41 (the second raw material trapping part 42) is stabilized, which more easily stabilizes an amount of the raw material charged in the first raw material trapping part 41 (the second raw material trapping part 42). The flow rate of the carrier gas at this time may be 3 slm or greater.

Further, in the foregoing embodiment, the refill amount of the raw material in the second raw material refilling process has been described to be adjusted by adjusting the period of trapping time t in the second raw material refilling process of step S5, but may be adjusted by adjusting the trapping rate ΔM of the raw material. As an example, the trapping rate ΔM of the raw material may be adjusted by adjusting a weight of the raw material supplied from the raw material vessel 3 through adjustment of the flow rate of the carrier gas supplied to the raw material vessel 3, while constantly setting a period of trapping time of the raw material in the second raw material refilling process. Since the trapped amount of the raw material is determined by the product of the time required for refilling and the trapped amount (trapping rate) per unit time, in the above embodiment, the time required for refilling has been described to be determined by making the trapping rate uniform. In this embodiment, a method of changing a trapping rate while constantly maintaining a time required for refilling is provided. Specifically, a relationship between the flow rate of the carrier gas supplied to the raw material vessel 3 and the trapping rate may be stored in the memory 91 according to a residual amount of the solid raw material 300 within the raw material vessel 3. Further, as described above, the residual amount of the solid raw material 300 may be estimated from a previously prepared correspondence relationship, based on the trapping rate obtained at the time of completing the first raw material refilling process. In some embodiments, a refill amount of the raw material may be adjusted by adjusting both the trapping time t and the trapping rate ΔM.

Further, the raw material used for the film forming process is not limited to $WCl_6$. As an example, the raw material used for film forming process may be tungsten pentachloride ($WCl_5$), molybdenum pentachloride ($MoCl_5$), zirconium chloride ($ZrCl_4$) (IV), hafnium chloride ($HfCl_4$) (IV), aluminum chloride ($AlCl_3$), or the like.

According to the present disclosure, a raw material within the raw material vessel is supplied to a raw material trapping part where the raw material is temporarily trapped (re-solidified) and subsequently, the raw material trapped in the raw material trapping part is supplied to a consumption area. An increase in amount of the raw material trapped in the raw material trapping part is obtained by measuring trapped amounts (charge amounts) of the raw material before and after the trapping of the raw material. Based on the increase, a period of time required to trap the raw material, and a trapped amount at the time of completing the trapping of the raw material, at least one of a period of refilling time and a trapping rate until the trapped amount reaches a target value is obtained. That is to say, a trapped amount of the raw material per unit time is obtained so that at least one of the period of refilling time and the trapping rate until the current trapped amount reaches the target value is calculated. Based on at least one of the period of refilling time and the trapping rate thus obtained, the raw material within the raw material vessel is refilled into the raw material trapping part. Therefore, when the raw material within the raw material vessel is supplied to the raw material trapping part where the raw material is trapped, trapped amounts of the raw material obtained at each trapping trapped are uniform, which makes it possible to stably supply the raw material to the consumption area.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A raw material supply method for use in a raw material supply apparatus including a raw material vessel configured to store a solid raw material and a raw material trapping part configured to temporarily trap a raw material transmitted from the raw material vessel, the method comprising:
   sublimating the solid raw material stored in the raw material vessel and transmitting the sublimated raw material together with a carrier gas to the raw material trapping part such that the sublimated raw material is trapped in the raw material trapping part;
   precipitating, in the raw material trapping part, the sublimated raw material;
   measuring a first trapped amount of the precipitated raw material trapped in the raw material trapping part and a second trapped amount of the precipitated raw material trapped in the raw material trapping part after a predetermined period of time, and calculating a difference between the first trapped amount and the second trapped amount as an increase in trapped amount of the precipitated raw material trapped in the raw material trapping part;
   obtaining at least one of a period of time required to reach the trapped amount of the precipitated raw material trapped in the raw material trapping part to a target value and a trapping rate of the precipitated raw material, based on the increase, a period of time required to trap the raw material, and a trapped amount of the precipitated raw material at the time of completing trapping the raw material;
   refilling the sublimated raw material into the raw material trapping part from the raw material vessel based on the at least one of the period of refilling time and the trapping rate; and
   subsequently, sublimating the raw material in the raw material trapping part, which has been precipitated therein, and supplying the sublimated raw material together with the carrier gas to a consumption area from the raw material trapping part.

2. The method of claim 1, further comprising: after refilling the sublimated raw material and before supplying the sublimated raw material from the raw material trapping part to the consumption area, measuring a trapped amount of the raw material, which is precipitated, trapped in the raw material trapping part.

3. The method of claim 2, further comprising: if it is determined that the trapped amount of the precipitated raw material is smaller than the target value based on the measured trapped amount of the precipitated raw material after refilling the sublimated raw material, further refilling the sublimated raw material from the raw material vessel to the raw material trapping part.

4. The method of claim 1, further comprising: correcting a flow rate of the carrier gas supplied to the raw material vessel based on the increase and the period of time required to trap the raw material.

5. The method of claim 1, wherein the raw material trapping part includes a first raw material trapping part and a second raw material trapping part which are connected in parallel to each other, and
   the method further comprises: in the course of supplying the sublimated raw material from one of the first raw material trapping part and the second raw material trapping part to the consumption area, refilling the sublimated raw material into the other of the first raw material trapping part and the second raw material trapping part from the raw material vessel.

* * * * *